(12) United States Patent
Dillon

(10) Patent No.: US 7,295,070 B2
(45) Date of Patent: Nov. 13, 2007

(54) FLIP AROUND SWITCHED CAPACITOR AMPLIFIER

(75) Inventor: Christopher Dillon, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 122 days.

(21) Appl. No.: 11/157,527

(22) Filed: Jun. 21, 2005

(65) Prior Publication Data

US 2006/0284678 A1 Dec. 21, 2006

(51) Int. Cl.
*H03F 3/45* (2006.01)
(52) U.S. Cl. ..................... 330/258; 330/292; 330/310
(58) Field of Classification Search ............... 330/252, 330/258, 292, 310, 109
See application file for complete search history.

(56) References Cited

U.S. PATENT DOCUMENTS

| | | | | |
|---|---|---|---|---|
| 4,458,212 A | * | 7/1984 | Brehmer et al. | 330/260 |
| 5,204,639 A | * | 4/1993 | Moore et al. | 330/294 |
| 5,880,631 A | * | 3/1999 | Sahota | 330/51 |
| 5,880,634 A | * | 3/1999 | Babanezhad | 330/126 |
| 6,002,299 A | * | 12/1999 | Thomsen | 330/9 |
| 6,340,918 B2 | * | 1/2002 | Taylor | 330/292 |
| 6,531,921 B2 | * | 3/2003 | Horie | 330/255 |

* cited by examiner

*Primary Examiner*—Patricia Nguyen
(74) *Attorney, Agent, or Firm*—Wolf, Greenfield & Sacks, P.C.

(57) ABSTRACT

A flip around amplifier circuit is provided that includes an amplifier having first and second amplification stages, a Miller capacitor, and a resistive element in series with the Miller capacitor, where an output line of the second amplification stage can be coupled to an output line of the first amplification stage through the Miller capacitor and the series resistive element. The circuit can include a feedback capacitor having a first plate coupled to an input line of the amplifier, and a flip around switch that can be operated so as to connect an output line of the amplifier to a second plate of the feedback capacitor. The circuit's classical transfer function can include a zero associated with the Miller capacitor and the series resistive element, and a pole associated with the feedback capacitor and the on-resistance of the flip around switch, where the zero is substantially equal to the pole.

25 Claims, 6 Drawing Sheets

US 7,295,070 B2

FLIP AROUND SWITCHED CAPACITOR AMPLIFIER

BACKGROUND

Flip around switched capacitor amplifier circuits can be used in various applications. For example, such circuits may be used as residue stages in pipelined analog-to-digital (A/D) converters. Flip around switched capacitor amplifier circuits can allow for the sampling of an input voltage onto an effective input capacitor composed of two unit capacitance values, C, so that the input can be effectively sampled onto an input capacitor of size 2C. Since input sampled noise is proportional to $\sqrt{KT/C}$, input sampled noise and hence resolution can be influenced by the input sampling capacitance.

SUMMARY

In one embodiment, an amplifier is provided that comprises first and second amplification stages. The second amplification stage comprises at least one bipolar transistor, wherein a first output line of the first amplification stage is coupled to a first input line of the second amplification stage. The amplifier also comprises a first capacitor and a first resistive element in series with the first capacitor, wherein a first output line of the second amplification stage is coupled to the first output line of the first amplification stage through the first capacitor and the first resistive element.

In one embodiment, a circuit is provided that comprises an amplifier including a first amplification stage, a second amplification stage having a first input line coupled to a first output line of the first amplification stage, a first resistive element in series with a first capacitor, wherein first output line of the second amplification stage is coupled to the first output line of the first amplification stage through the first capacitor and the first resistive element. The circuit also comprises a second capacitor having a first plate coupled to a first input line of the amplifier, and a first switch being operable to connect a first output line of the amplifier to a second plate of the second capacitor. A classical transfer function associated with the circuit comprises a zero at least partially associated with the first capacitor and the first resistive element, and a pole at least partially associated with the second capacitor and an on-resistance of the first switch, wherein the zero is substantially equal to the pole.

In one embodiment, a method is provided for compensating a circuit, wherein the circuit comprises an amplifier. The amplifier comprises a first amplification stage, a second amplification stage having a first input line coupled to a first output line of the first amplification stage, a first resistive element in series with a first capacitor, wherein a first output line of the second amplification stage is coupled to the first output line of the first amplification stage through the first capacitor and the first resistive element. The circuit further comprises a second capacitor having a first plate coupled to a first input line of the amplifier, and a first switch being operable to connect a first output line of the amplifier to a second plate of the second capacitor. The method comprises selecting a resistance of the first resistive element so that a classical transfer function associated with the circuit comprises a zero at least partially associated with the first capacitor and the first resistive element, wherein the zero is substantially equal to a pole at least partially associated with the second capacitor and an on-resistance of the first switch.

BRIEF DESCRIPTION OF DRAWINGS

In the drawings, each identical or nearly identical component that is illustrated in various figures is represented by a like numeral. For purposes of clarity, not every component may be labeled in every drawing. In the drawings.

DETAILED DESCRIPTION

Figure 1:
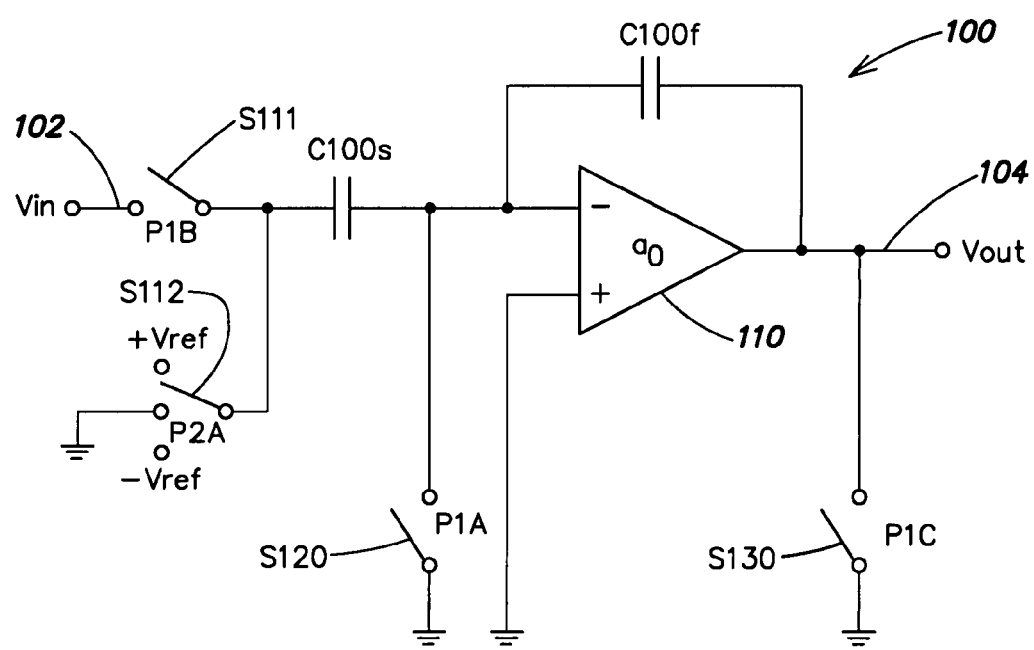
FIG. 1 is a schematic diagram of a prior art amplifier circuit without a flip around architecture.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

To illustrate the design considerations associated with a flip around switched capacitor amplifier circuit, a comparison between an amplifier circuit with and without a flip around architecture is presented below.

FIG. 1 shows a schematic diagram of prior art amplifier circuit 100 without a flip around architecture, which can be used as a 1.5 bit residue stage in a switched capacitor pipelined A/D converter. The amplifier circuit 100 receives an input voltage signal $V_{in}$ on input line 102 and outputs a voltage output signal $V_{out}$ on output line 104. Feedback capacitor C100f couples the output line 104 to the negative input terminal of amplifier 110, and the positive input terminal of amplifier 110 is grounded. Amplifier circuit 100 also comprises a sampling capacitor C100s having a first plate coupled to the negative input terminal of amplifier 110 and a second plate coupled to switches S111 and S112.

Switch S111 may be in an open or closed state and may be controlled by a timing signal P1B. In a closed state, switch S111 acts as a conduction path and couples the input line 102 to a second plate of sampling capacitor C100s, whereas in an open state, switch S111 acts as an open circuit and does not couple the input line 102 to sampling capacitor C100s.

Similarly, switch S112 may in closed or open states, and may be controlled by a timing signal P2A. When switch S112 is in a closed state, the second plate of sampling capacitor C100s is coupled to ground. When switch S112 is in a first open state, the second plate of sampling capacitor C100s is coupled to reference voltage $+V_{ref}$, and when switch S112 is in a second open state, the second plate of sampling capacitor C100s is coupled to reference voltage $-V_{ref}$.

Amplifier circuit 100 also comprises a switch S120 that can be controlled by timing signal P1A, where in a closed state, switch S120 couples the first plate of sampling capacitor C100s to ground. In addition, a switch S130 can be controlled by a timing signal P1C and placed in a closed state such that switch S130 couples the output line 104 to ground.

For the amplifier circuit 100, the input sampling capacitance is $C_s$ and the feedback capacitance is $C_f$. To realize a closed loop gain of two, a designer can set $C_s=2C_f$, and since the feedback factor for the circuit is $\beta_r=C_f/(C_s+C_f)$, then $\beta_r=\frac{1}{3}$. When amplifier 110 is a two stage amplifier with DC gain of $a_o$, the closed loop gain bandwidth of amplifier circuit 100 is $$A_{cl}(j\omega) = \beta_f \frac{\dfrac{a_o}{\left(1+\dfrac{s}{\omega_1}\right)\left(1+\dfrac{s}{\omega_2}\right)}}{1+\beta_r\left[\dfrac{a_o}{\left(1+\dfrac{s}{\omega_1}\right)\left(1+\dfrac{s}{\omega_2}\right)}\right]},$$

where $s=-j\omega$, $\beta_f$ of is the feedforward factor and $\beta_r$ is the feedback factor.

In contrast, by using a flip around amplifier architecture, a switch network can be used to connect a portion (e.g., half) of the total input sampling capacitance around the amplifier to serve as the feedback capacitor during time intervals when the amplifier switches from sample to gain mode.

Figure 2:
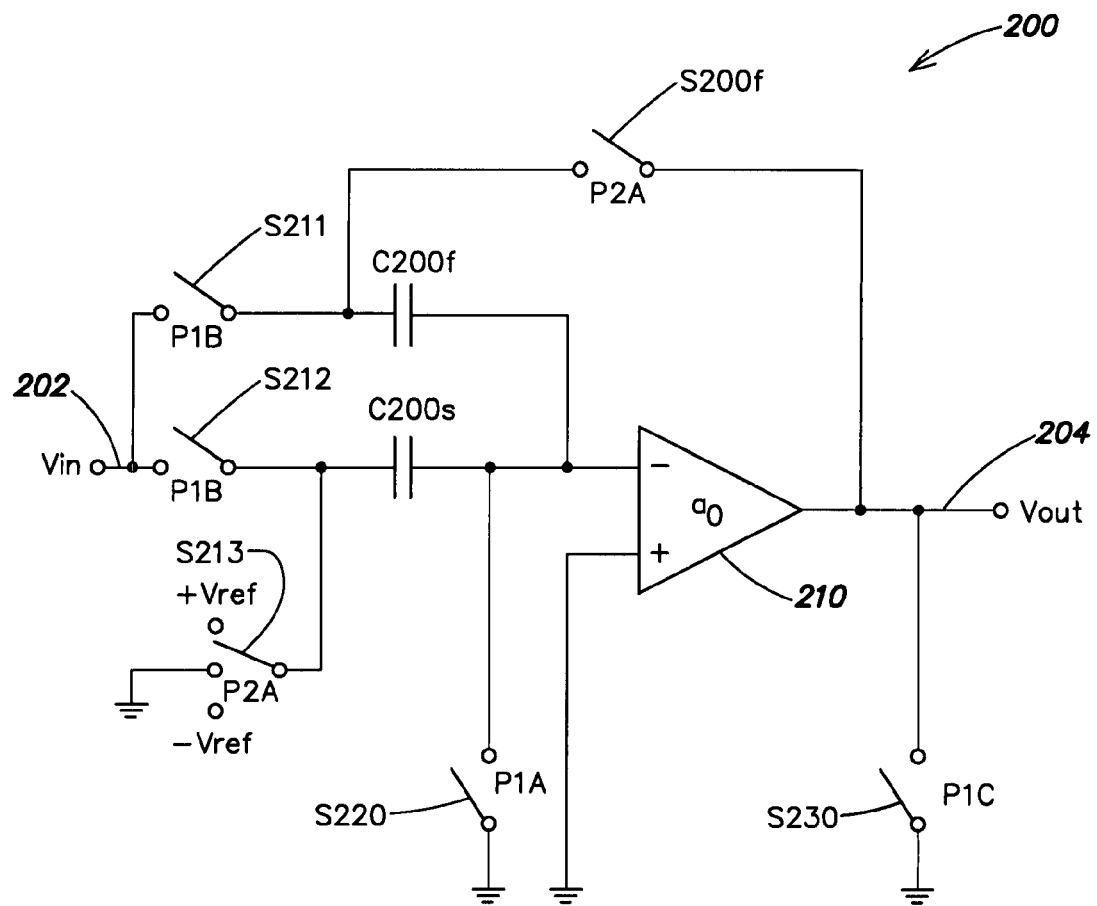
FIG. 2 is a schematic diagram of a prior art amplifier circuit with a flip around architecture.

FIG. 2 is a schematic diagram of a prior art amplifier circuit 200 with a flip around architecture. Amplifier circuit 200 is similar to amplifier circuit 100 presented in FIG. 1, but the feedback capacitor C200f also contributes to the total input sampling capacitance. This is achieved by including a feedback switch S200f between output voltage line 204 and a first plate of the feedback capacitor C200f. The first plate of feedback capacitor C200f can also be coupled to the input voltage line 202 via a switch S211. A second plate of capacitor C200f is coupled to a negative input terminal of amplifier 210.

Switch S211 is controlled with a timing signal P1B, which also controls switch S212 that can couple the input voltage line 202 to a first capacitor plate of a sampling capacitor C200s.

Switch S200f is controlled by a timing signal P2A that also controls a switch S213 which can couple the first plate of the sampling capacitor C200s to ground, $+V_{ref}$ or $-V_{ref}$.

Switch S220 is controlled by a timing signal P1A, and can couple the second plates of capacitors C200s and C200f to ground. The second plates of capacitors C200s and C200f are also coupled to the negative input terminal of amplifier 210, whereas the positive input terminal of amplifier 210 is connected to ground.

Switch S230 is controlled by a timing signal P1C and can placed in a closed state such that switch S230 couples the output line 204 to ground.

The flip around amplifier circuit 200 can realize a gain of two when $C_s=C_f$, and, in such a case, possesses the same input sampling capacitance as amplifier circuit 100. In contrast, amplifier circuit 200 has a feedback factor $\beta_r=C_f/(C_s+C_f)=\frac{1}{2}$, if the series on-resistance of switch S200f is ignored.

By increasing the feedback factor to one half, as compared to the feedback factor of one third for amplifier circuit 100, the bandwidth achieved by the amplifier circuit 200 can be extended, while maintaining similar input sampled noise characteristics as amplifier circuit 100.

Applicant has appreciated that a problem encountered with flip around amplifier circuits is that the flip around switch has a series on-resistance that produces a pole in the feedback path when combined with feedback and sampling capacitors.

By modeling the feedback network of amplifier circuit 200 with closed switch S200f as an on-resistance $R_{on}$, where $R_{on}$ is the resistance introduced in the feedback path due the closed switch S200f, the feedback network's transfer function is given by $$\beta_r(j\omega) = \left[\frac{C_f}{C_s+C_f}\right]\left[\frac{1}{1+s\left(\dfrac{R_{on}C_sC_f}{C_s+C_f}\right)}\right],$$

which implies that a pole is present at $\omega_{pole}=(C_s+C_f)/R_{on}C_sC_f$ where $C_s$ is the capacitance of capacitor C200s and $C_f$ is the capacitance of capacitor C200f. Similarly, the transfer function for the feedforward network is $$\beta_f(j\omega) = \left[\frac{C_f}{C_s+C_f}\right]\left[\frac{1+s(R_{on}C_f)}{1+s\left(R_{on}\dfrac{C_sC_f}{C_s+C_f}\right)}\right],$$

which contains a pole at the same location as in the feedback factor, in addition to a zero at $-(R_{on}C_f)^{-1}$. Combining all of the elements of the feedback network into a classical form for the closed loop gain, $A_{cl}(j\omega)=\beta_f a_o/(1+\beta_r a_o)$, gives the transfer function $$A_{cl}(j\omega) = \frac{\left[\dfrac{C_s}{C_s+C_f}\right]\left[\dfrac{1+s(R_{on}C_f)}{1+s\left(\dfrac{R_{on}C_sC_f}{C_s+C_f}\right)}\right]\left[\dfrac{a_o}{\left(1+\dfrac{s}{\omega_{p1}}\right)\left(1+\dfrac{s}{\omega_{p2}}\right)}\right]}{1+\left[\dfrac{C_f}{C_s+C_f}\right]\left[\dfrac{1}{1+s\left(\dfrac{R_{on}C_sC_f}{C_s+C_f}\right)}\right]\left[\dfrac{a_o}{\left(1+\dfrac{s}{\omega_{p1}}\right)\left(1+\dfrac{s}{\omega_{p2}}\right)}\right]},$$

which has a pole due to the flip around switch S200f on-resistance $R_{on}$.

Applicant has appreciated that a frequency compensation technique can be used in a manner so as to cancel one or more poles in the transfer function of a flip around amplifier circuit. A resistance can be incorporated in series with a Miller capacitance so as to introduce a zero that can cancel the pole in the feedback factor introduced by the flip around switch. The resistance can be chosen so that the zero is substantially equal to the location of the pole in the feedback factor, and therefore the zero and the pole can cancel each other. The resistance can be due to a metal-oxide-semiconductor field effect transistor (MOSFET) such that the resistance tracks the flip around switch resistance, and can allow the zero and the pole to track each other with lot variations.

In the prior art, such a design is incorporated into a MOS amplifier (i.e., an amplifier using MOSFET transistors and no bipolar transistors), where the transconductance $G_m$ of the second stage is low because of the use of MOSFETs. This transconductance $G_m$ combined with a Miller capacitance in the amplifier can create a right half plane zero that can be near the non-dominant pole. This right half plane zero can degrade phase margin and stability significantly but can be moved to the left half plane by inserting a series resistance of value $1/G_m$ with the Miller capacitance. In contrast, when the second stage transconductance device is a bipolar transistor, the transconductance $G_m$ is large and the zero associated with the $G_m$ does not significantly degrade performance, and therefore, the prior art does not teach the insertion of a series resistance with the Miller capacitance.

In some embodiments, a circuit includes a two stage amplifier and a resistive element in series with a Miller capacitor. In some embodiments, an amplifier comprising at least one bipolar transistor includes a resistive element in series with a Miller capacitor.

In some embodiments, a flip around amplifier circuit comprises an amplifier with a resistive element in series with a Miller capacitor that can introduce a zero that is substantially equal to a pole associated with a feedback factor of a flip around switch.

Figure 3:
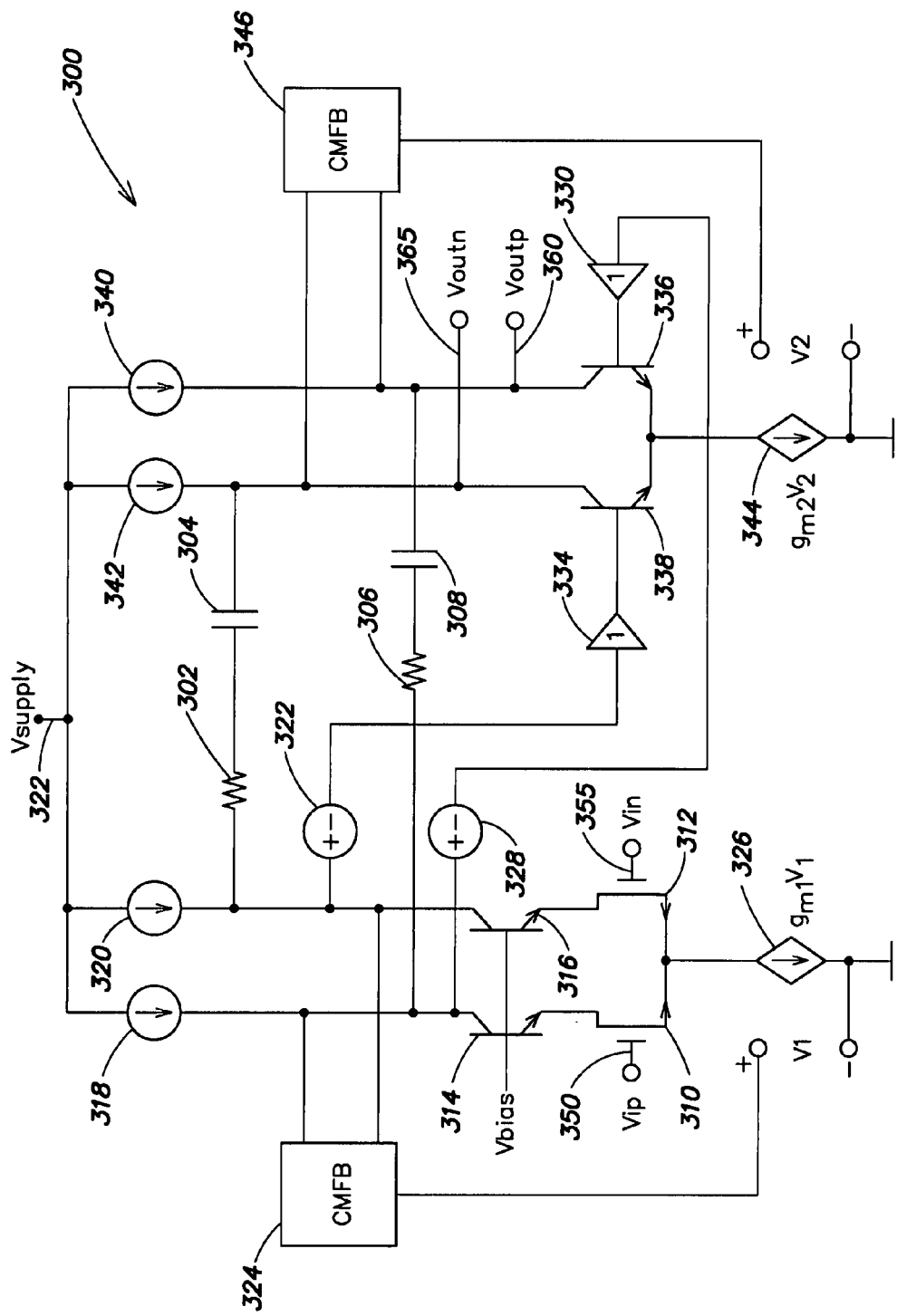
FIG. 3 is a circuit diagram of a two stage amplifier with Miller capacitors and series resistive elements, in accordance with one embodiment.

FIG. 3 illustrates a simplified circuit diagram of a two stage amplifier 300 with Miller capacitors and series resistive elements, in accordance with one embodiment of the invention. Amplifier 300 comprises a first stage, including MOSFETs 310 and 312, and a second stage, including bipolar transistors 336 and 338. Amplifier 300 is a fully differential amplifier including two input lines 350 and 355, and two output lines 360 and 365. Input line 350 can receive a input voltage signal $V_{ip}$ and input line 355 can receive an input voltage $V_{in}$. Output line 365 can output an output voltage signal $V_{outn}$ and output line 360 can output an output voltage signal $V_{outp}$.

In the embodiment of FIG. 3, transistors 310 and 312 comprise NMOS transistors, but it should be appreciated that the invention is not limited in this respect, and any other transistor types (e.g., PMOS transistors, bipolar transistors, etc.) may be utilized. The gate terminal of transistor 310 is coupled to input line 350, and the gate terminal of transistor 312 is coupled to input line 355. The drain terminal of transistor 310 is coupled to the emitter of a bipolar transistor 314. Similarly, the drain terminal of transistor 312 is coupled to an emitter of a bipolar transistor 316.

Bipolar transistors 314 and 316 may be biased via the application of a bias voltage $V_{bias}$ to the bases of the bipolar transistors 314 and 316. The collector of bipolar transistor 314 is coupled to a terminal of a current source 318, and the other terminal of current source 318 is coupled to a voltage supply line 322, that may have a supply voltage $V_{supply}$ applied. Similarly, the collector of bipolar transistor 316 is coupled to a current source 320 which has another terminal connected to the voltage supply line 322. The collector of bipolar transistor 314 can serve as the positive output terminal for the first stage, and the collector of bipolar transistor 316 can serve as the negative output terminal for the first stage. It should be recognized that although transistors 314 and 316 are shown as bipolar transistors in the embodiment of FIG. 3, transistors 314 and/or 316 may be any type of transistor, including MOSFETs (e.g., NMOS and/or PMOS), metal-semiconductor field effect transistors (MESFETs), or any other transistor, as the invention is not limited in this respect.

The first stage of amplifier circuit 300 also comprises a common mode feedback (CMFB) circuit 324 that has one input line coupled to the collector of bipolar transistor 314 and another input line coupled to the collector of bipolar transistor 316. CMFB circuits can stabilize active loads in transconductor circuits. In amplifier 300, the CMFB circuit 324 compares the common mode voltage of the collectors of bipolar transistors 314 and 316 to a reference voltage and generates a voltage V1 which can control a voltage controlled current source 326 possessing a transconductance $g_{m1}$. The voltage controlled current source 326 has one terminal coupled to ground and another terminal coupled to the sources of transistors 310 and 312. Therefore, the voltage controlled current source 326 can regulate the combined current outputted from the sources of transistors 310 and 312 so that the combined current equals $g_{m1}V_1$.

The positive output terminal of the first stage (i.e., the collector of bipolar transistor 314) is coupled to a terminal of a voltage difference source 328 which has another terminal coupled to an input terminal of a unity gain buffer 330. The output of the unity gain buffer 330 is coupled to the base of bipolar transistor 336 of the second stage. The collector of bipolar transistor 336 is coupled to a terminal of a current source 340 having another terminal coupled to the voltage supply line 322.

The negative output terminal of the first stage (i.e., the collector of bipolar transistor 316) is coupled to a terminal of a voltage difference source 322 which has another terminal coupled to an input terminal of unity gain buffer 334. The output terminal of unity gain buffer 334 is coupled to the base of bipolar transistor 338 of the second stage. The collector of bipolar transistor 338 is coupled to a terminal of a current source 342 having another terminal coupled to the voltage supply line 322.

As in the first stage, a CMFB circuit 346 is incorporated in the second stage. The CMFB circuit 346 has one input line coupled to the collector of bipolar transistor 336 and another input line coupled to the collector of bipolar transistor 338. The CMFB circuit 346 compares the common mode voltage of the collectors of bipolar transistors 336 and 338 to a reference voltage and generates a voltage $V_2$ which can control a voltage controlled current source 344 possessing a transconductance $g_{m2}$. The voltage controlled current source 344 has one terminal coupled to ground and another terminal coupled to the emitters of transistors 336 and 338. Therefore, the voltage controlled current source 344 can regulate the combined current outputted from the emitters of transistors 336 and 338 so that the combined current equals $g_{m2}V_2$. In one embodiment, transconductance $g_{m2}$ of voltage controlled current source 344 is equal to the transconductance $g_{m1}$ of voltage controlled current source 326.

Amplifier circuit 300 comprises a Miller capacitor (i.e., compensation capacitor) 304 having a first plate coupled to the negative output line 365, and a resistive element 302 having one terminal coupled to a second plate of the Miller capacitor 304 and another terminal coupled to the collector of transistor 316 of the first stage.

Amplifier circuit 300 also comprises a Miller capacitor 308 that has a first plate coupled to the positive output line 360 and a second plate coupled to a resistive element 306 which has another terminal coupled to the collector of transistor 314 of the first stage.

The resistive elements 302 and 306 may comprise passive resistive elements (e.g., doped semiconductor regions), active resistive elements (e.g., MOSFETs), or any other type of resistive element, as the invention is not limited in this respect. The resistive elements 302 and 306 may introduce one or more zeros in the transfer function of the amplifier 300. The resistive elements 302 and 306 may possess resistance values that are associated with one or more zeros that can cancel one or more poles of the transfer function of a circuit in which amplifier 300 is incorporated.

In one embodiment, amplifier 300 can be used as the amplifier 210 in circuit 200 of FIG. 2. The transfer function for the amplifier 300 incorporated into the flip around architecture circuit 200 of FIG. 2 is given by $$A_{cl}(j\omega) = \frac{\left[\frac{C_s}{C_s+C_f}\right]\left[\frac{1+s(R_{on}C_f)}{1+s\left(\frac{R_{on}C_sC_f}{C_s+C_f}\right)}\right]\left[\frac{a_o\left(1+\frac{s}{\omega_{zero}}\right)}{\left(1+\frac{s}{\omega_{p1}}\right)\left(1+\frac{s}{w_{p2}}\right)}\right]}{1+\left[\frac{C_s}{C_s+C_f}\right]\left[\frac{1}{1+s\left(\frac{R_{on}C_sC_f}{C_s+C_f}\right)}\right]\left[\frac{a_o\left(1+\frac{s}{\omega_{zero}}\right)}{\left(1+\frac{s}{\omega_{p1}}\right)\left(1+\frac{s}{w_{p2}}\right)}\right]}.$$

The Miller capacitor and series resistive element contribute to a zero in the amplifier's transfer function due to the term $(1+s/\omega_{zero})$. If $\omega_{zero}=(C_s+C_f)/R_{on}C_sC_f$, then this zero can cancel with the pole in the feedback and feedforward factor and the transfer function equation reduces to one similar to the non flip around amplifier circuit 100, while still retaining the advantage of a higher feedback factor, which can imply an extended bandwidth.

In accordance with some embodiments, an amplifier with at least one Miller capacitor and at least one series resistive element may be used in a flip around amplifier circuit. The flip around amplifier circuit may be a single input/output version, a fully differential version having two inputs and outputs, or any other version, as the invention is not limited in this respect.

In some embodiments, a flip around amplifier circuit including an amplifier with at least one Miller capacitor and at least one series resistive element may be used as a stage in an A/D converter. In some embodiments, a flip around amplifier circuit including an amplifier with at least one Miller capacitor and at least one series resistive element may be used as a 1.5 bit residue stage in a switched capacitor, pipelined A/D converter. The amplifier with the resistive element in series with a Miller capacitor can introduce a zero that is substantially equal to a pole associated with a feedback factor of a flip around switch.

Figure 4:
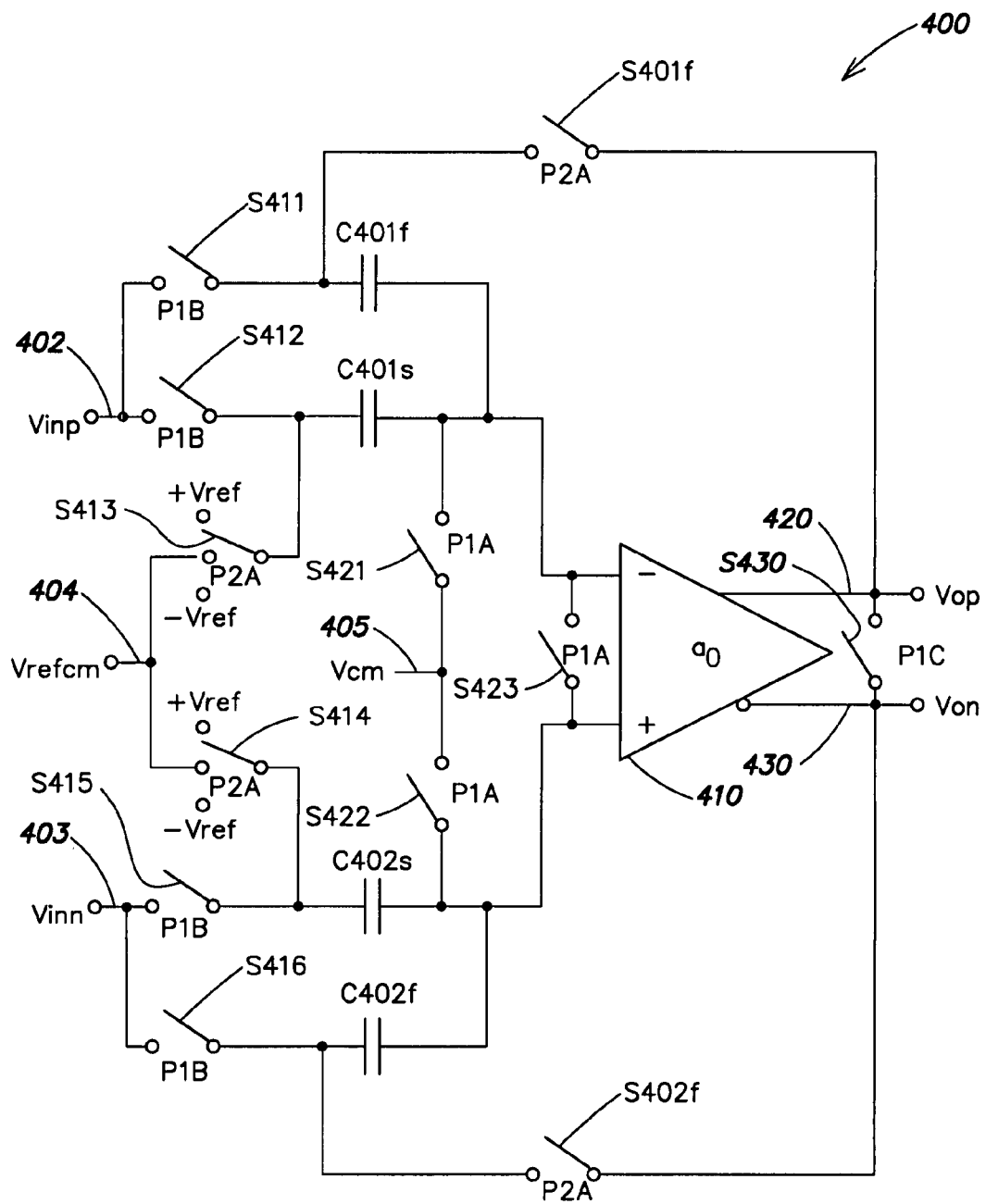
FIG. 4 is a schematic diagram of a flip around amplifier circuit comprising an amplifier having one or more Miller capacitors and series resistive elements, in accordance with one embodiment.

FIG. 4 illustrates a schematic diagram of a fully differential version of a flip around amplifier circuit 400 comprising an amplifier 410 having one or more Miller capacitors and series resistive elements. The one or more Miller capacitors and series resistive elements may have associated zeros that may cancel out poles associated with the on-resistances of the flip around switches S401f and S402f of the amplifier circuit 400. In one embodiment, amplifier 410 may comprise amplifier 300.

Amplifier 410 has a positive output terminal connected to an output line 420 and a negative output terminal coupled to an output line 430. The output line 420 may be coupled to a first plate of a feedback capacitor C401f through a feedback switch S401f. The feedback switch S401f may be controlled so as to be in an open or closed state using a timing signal P2A. A second plate of the feedback capacitor C401f is coupled to a negative input terminal of amplifier 410. The first plate of feedback capacitor C401f may also be coupled to an input line 402 through a switch S411. Switch S411 may be controlled so as to be in an open or closed state using a timing signal P1B. A sampling capacitor C401s has a first plate that may be coupled to the input line 402 through switch S412, which may be controlled so as to be in an open or closed state using a timing signal P1B. The capacitor C401s has a second plate coupled to the negative input terminal of amplifier 410.

The output line 430 may be coupled to a first plate of a feedback capacitor C402f through a feedback switch S402f.

The feedback switch S402f may be controlled so as to be in an open or closed state using a timing signal P2A. A second plate of the feedback capacitor C402f is coupled to a positive input terminal of amplifier 410. The first plate of feedback capacitor C402f may also be coupled to an input line 403 through a switch S416. Switch S416 may be controlled so as to be in an open or closed state using a timing signal P1B. A sampling capacitor C402s has a first plate that may be coupled to the input line 403 through switch S415, which may be controlled so as to be in an open or closed state using a timing signal P1B. The capacitor C402s has a second plate coupled to the positive input terminal of amplifier 410.

Amplifier circuit 400 comprises a switch S430 that, when in a closed state, can couple the positive output line 420 to the negative output line 430. The switch S430 may be controlled, and placed in a closed or open state, via the application of a timing signal P1C. A switch S423 can couple the negative and positive input terminals of amplifier 410, and can be controlled via a timing signal P1A.

A switch S421 can couple the second plate of capacitor C401s to a common mode voltage line 405, and may be controlled so as to be in a closed or open state via the application of a timing signal P1A. The common mode voltage line 405 may have an applied voltage $V_{cm}$ which is the common mode voltage associated with the input voltages applied to positive and negative input terminals of the amplifier 410. A switch S422 may couple the second plate of capacitor C402s to the common mode voltage input line 405, and may be controlled so as to be in a closed or open state via the application of the timing signal P1A.

Switch S413 may couple the first plate of capacitor C401s to a common mode voltage line 404 or to $+V_{ref}$ or $-V_{ref}$ voltage reference terminals, and may be controlled so as to be in a closed or open state via the application of a timing signal P2A. Switch S414 may couple the first plate of capacitor C402s to the common mode voltage line 404 or to $+V_{ref}$ or $-V_{ref}$ voltage reference terminals, and may be controlled so as to be in a closed or open state via the application of a timing signal P2A. The common mode voltage line 404 may have an applied voltage $V_{cmref}$ which is the common mode voltage associated with the reference voltages $+V_{ref}$ and $-V_{ref}$.

Figure 5:
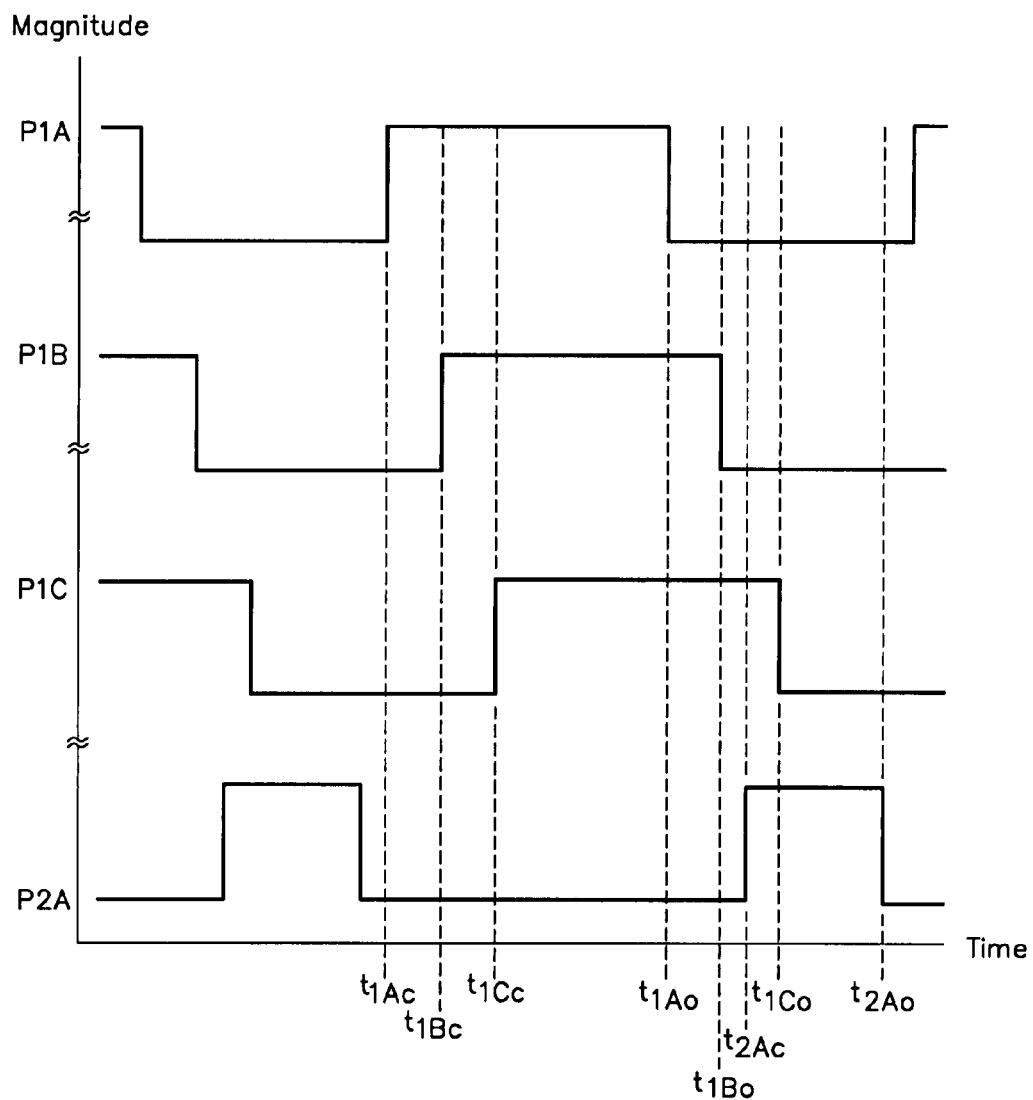
FIG. 5 is a diagram of timing signals that may be employed with amplifier circuits of FIGS. 4 and 6, in accordance with one embodiment.

FIG. 5 shows timing signals that may be employed with amplifier circuit 400. Each of the timing signals has two logic states represented by high and low levels (e.g., voltages). Although the timing signals are shown on the same time axis, this does not signify that one attains different levels than the others, although it does not preclude it.

In the timing signals shown in FIG. 5, a high level applied to a switch control terminal can cause the switch to enter a closed state, and a low level applied to the switch control terminal can cause the switch to enter an open state, but the invention is not limited in this respect. For example, a switch could be such that it could enter a closed state when the signal applied to the control terminal is low and an open state when the signal applied to the control terminal is high. In such a case, the timing signals of FIG. 5 can be inverted so that high levels become low levels, and vice versa.

Timing signal P1A can control switches S421, S422 and S423, which, when closed, can define the voltage that the input signals on line 402 and 403 should be sampled with respect to using capacitors C401s, C401f, C402s and C402f. In amplifier circuit 400, signals on lines 402 and 403 are sampled with respect to the common mode voltage $V_{cm}$ present on line 405. The timing signal P1A attains a high level at a time $t_{1Ac}$, after which switches S421, S422 and S423 are placed in closed states, thereby setting the second plates of capacitors C401s, C401f, C402s and C402f to the common mode voltage $V_{cm}$. The timing signal P1A remains at a high level until a time $t_{1Ao}$, after which the timing signal P1A attains a low level and switches S421, S422 and S423 are placed in open states, thereby disconnecting the second plates of capacitors C401s, C401f, C402s and C402f from the common mode voltage line 405.

Timing signal P1B can control switches S411, S412, S415 and S416, which, when closed after a time $t_{1Bc}$, allow for voltage sampling on the first plates of capacitors C410s, C401f, C402s and C402f. During this sampling phase, timing signal P2A is at a low level, implying that switches S401f, S402f, S413 and S414 are in open states. Since, feedback switches S401f and S402f are open during this sampling phase, feedback loops around the amplifier 410 are not established and capacitors C410f and C402f act as sampling capacitors. Furthermore, switches S412 and S414 are in an open state and connect the first plates of capacitors C410s, C401f, C402s and C402f to reference voltages $+V_{ref}$ or $-V_{ref}$. The determination of which of these two voltages the switches S412 and S414 connect to may be performed via the use of a comparator flash. The timing signal P1B remains at a high level until a time $t_{1Bo}$, after which, the timing signal P1B attains a low level and switches S411, S412, S415 and S416 are placed in an open state.

Timing signal P1C defines a time interval, from times $t_{1Cc}$ to $t_{1Co}$, during which timing signal P1C attains a high level and switch S430 is closed, thereby coupling output lines 420 and 430. Timing signal P1C closes switch S430 that shorts the outputs of amplifier 410 together during a portion of the sampling phase (e.g., defined by P1B) and a portion of the gain phase (e.g., defined by P2A). Shorting of the outputs of amplifier 410 is desirable because the amplifier may have a large gain, such that, when the amplifier 410 transitions from sample to gain mode, it is desirable to control when the output of the amplifier 410 is released and can attain a final value. Because the amplifier 410 may possess a large gain, any small differential voltage appearing at the input can cause a large change in the output. The transition from sample to gain mode can introduce erroneous glitches that can send the amplifier 410 off in the wrong direction, but the application of timing signal P1C to switch S430 may alleviate these glitches.

Timing signal P2A can define the gain phase, ranging from times $t_{2Ac}$ to $t_{2Ao}$, during which the high level of timing signal P2A commands feedback switches S401f and S402f to a closed state, thereby establishing feedback loops including feedback capacitors C401f and C402f. During this gain phase, timing signal P1B attains a low level, and therefore switches S411, S412, S415, and S416 are in an open state. Also, switches S413 and S414 are in a closed state via the application of control signal P2A, and therefore, the first plates of capacitors C401s and C402s are coupled to common voltage line 404 having applied voltage $V_{refcm}$. During this gain phase, the signals sampled on capacitors C401f, C401s, C402f and C402s, during the sampling phase, can be amplified and output to output lines 420 and 430.

In the timing signals of FIG. 5, $t_{1Ac} < t_{1Bc} < t_{1Cc} < t_{1Ao} < t_{1Bo} < t_{2Ac} < t_{1Co} < t_{2Ao}$, although it should be recognized that the invention is not limited in this respect, and the order of the transitions of the timing signals may be different from what is illustrated in FIG. 5.

Although the above-mentioned embodiment is described in association with the amplifier circuit 400 which can be used as a 1.5 bit residue stage in a switched capacitor, pipelined A/D converter, it should be recognized that the invention is not limited in this respect, and can be used in other applications.

In some embodiments, a flip around amplifier circuit including an amplifier with at least one Miller capacitor and at least one series resistive element may be used as a stand alone switched capacitor sample and hold amplifier (SHA). An amplifier with a resistive element in series with a Miller capacitor can introduce a zero that is substantially equal to a pole associated with a feedback factor of a flip around switch.

Figure 6:
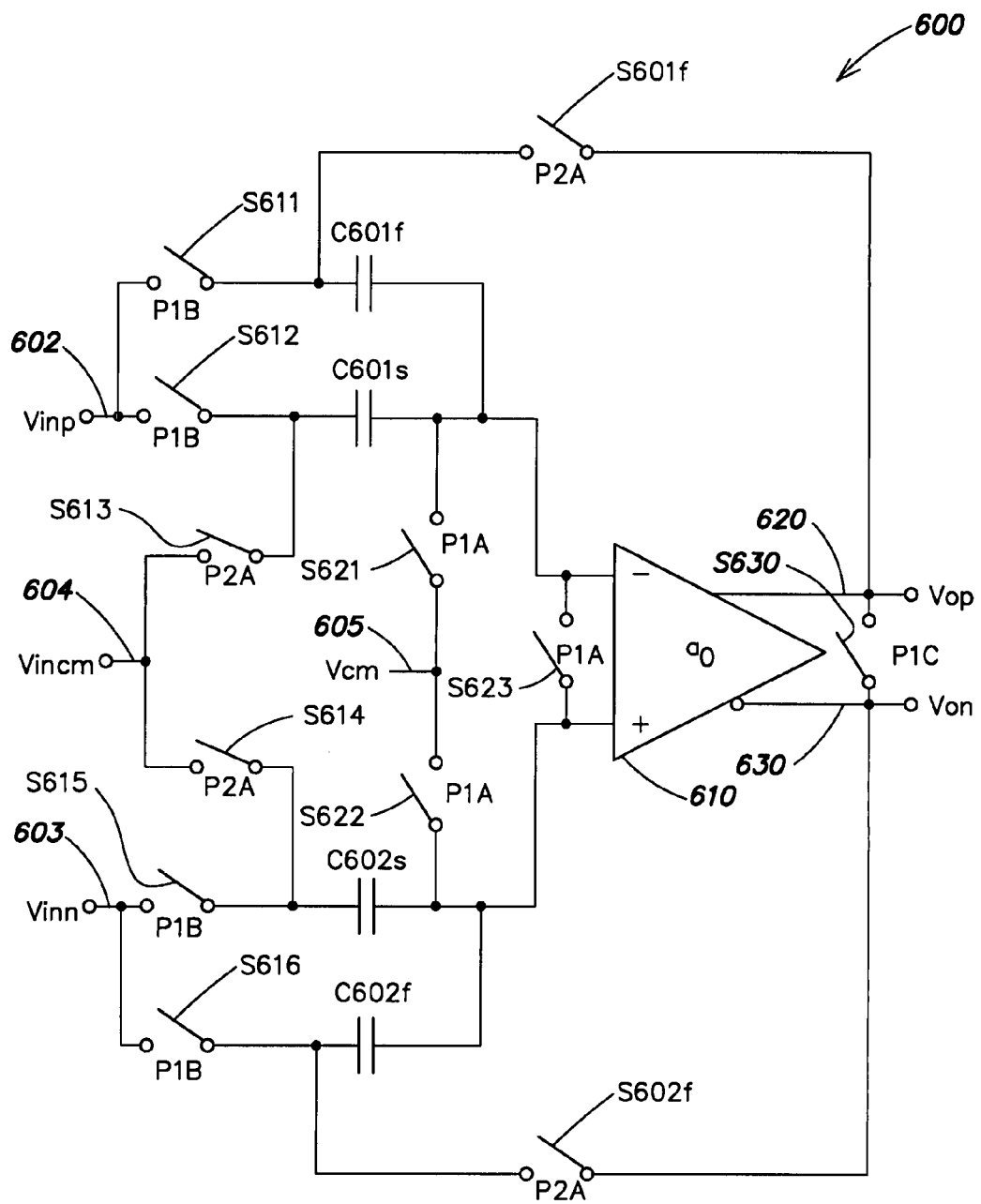
FIG. 6 is a schematic diagram of another flip around amplifier circuit comprising an amplifier having one or more Miller capacitors and series resistive elements.

FIG. 6 illustrates a schematic diagram of a fully differential sample and hold amplifier circuit 600, comprising an amplifier 610 having one or more Miller capacitors and series resistive elements. The capacitance and resistance of the one or more Miller capacitors and series resistive elements may be chosen to have associated zeros that may cancel out poles associated with the flip around switches S601f and S602f of amplifier circuit 600. In one embodiment, amplifier 610 may comprise amplifier 300.

Amplifier 610 has a positive output terminal connected to an output line 620 and a negative output terminal coupled to an output line 630. The output line 620 may be coupled to a first plate of a feedback capacitor C601f through a feedback switch S601f. The feedback switch S601f may be controlled so as to be in an open or closed state using a timing signal P2A. A second plate of the feedback capacitor C601f is coupled to a negative input terminal of amplifier 610. The first plate of feedback capacitor C601f may also be coupled to an input line 602 through a switch S611. Switch S611 may be controlled so as to be in an open or closed state using a timing signal P1B. A sampling capacitor C601s has a first plate that may be coupled to the input line 602 through switch S612, which may be controlled so as to be in an open or closed state using a timing signal P1B. The capacitor C601s has a second plate coupled to the negative input terminal of amplifier 610.

The output line 630 may be coupled to a first plate of a feedback capacitor C602f through a feedback switch S602f. The feedback switch S602f may be controlled so as to be in an open or closed state using a timing signal P2A. A second plate of the feedback capacitor C602f is coupled to a positive input terminal of amplifier 610. The first plate of feedback capacitor C602f may also be coupled to an input line 603 through a switch S616. Switch S616 may be controlled so as to be in an open or closed state using a timing signal P1B. A sampling capacitor C602s has a first plate that may be coupled to the input line 603 through switch S615, which may be controlled so as to be in an open or closed state using a timing signal P1B. The capacitor C602s has a second plate coupled to the positive input terminal of amplifier 610.

Amplifier circuit 600 comprises a switch S630 that, when in a closed state, can couple the positive output line 620 to the negative output line 630. The switch S630 may be controlled, and placed in a closed or open state, via the application of a timing signal P1C. A switch S623 can couple the negative and positive input terminals of amplifier 610, and can be controlled via a timing signal P1A.

A switch S621 can couple the second plate of capacitor C601s to a common mode voltage line 605, and may be controlled so as to be in a closed or open state via the application of a timing signal P1A. The common mode voltage line 605 may have an applied voltage $V_{cm}$ which is the common mode voltage associated with the input voltages applied to positive and negative input terminals of the amplifier 610. A switch S622 may couple the second plate of capacitor C602s to the common mode voltage input line 605, and may be controlled so as to be in a closed or open state via the application of the timing signal P1A.

Switch S613 may couple the first plate of capacitor C601s to a common mode voltage line 604, and may be controlled so as to be in a closed or open state via the application of a timing signal P2A. Switch S614 may couple the first plate of capacitor C602s to the common mode voltage line 604, and may be controlled so as to be in a closed or open state via the application of a timing signal P2A. The common mode voltage line 604 may have an applied voltage $V_{incm}$ which is the common mode voltage associated with input voltages on lines 602 and 603.

As in the amplifier circuit 400, FIG. 5 shows timing signals that may be employed with amplifier circuit 600 so as to enable a sample and hold operation, whereby the voltages on input lines 602 and 603 are sampled during the sample phase, and the an amplified output is presented on output lines 620 and 630 during the gain phase (i.e., hold phase).

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An amplifier comprising:
a first amplification stage;
a second amplification stage comprising at least one bipolar transistor, wherein a first output line of the first amplification stage is coupled to a first input line of the second amplification stage;
a first capacitor;
a first resistive element in series with the first capacitor, wherein a first output line of the second amplification stage is coupled to the first output line of the first amplification stage through the first capacitor and the first resistive element, wherein the first output line of the first amplification stage is coupled to the first input line of the second amplification stage through a unity gain buffer.

2. The amplifier of claim 1, further comprising:
a third capacitor; and
a third resistive element in series with the third capacitor, wherein a second output line of the second amplification stage is coupled to a second output line of the first amplification stage through the third capacitor and the third resistive element, and wherein the second output line of the first amplification stage is coupled to a second input line of the second amplification stage.

3. The amplifier of claim 1, wherein the first resistive element comprises at least one field effect transistor.

4. The amplifier of claim 3, wherein the first resistive element comprises at least one metal-oxide-semiconductor field effect transistor.

5. The amplifier of claim 1, provided in a circuit comprising: a second capacitor having a first plate coupled to a first input line of the amplifier; and
a first switch being operable to couple a first output line of the amplifier to a second plate of the second capacitor.

6. The circuit of claim 5, wherein the first input line of the amplifier is coupled to a first input line of the first amplification stage.

7. The circuit of claim 5, wherein the first output line of the amplifier is coupled to the first output line of the second amplification stage.

8. The circuit of claim 5, wherein a classical transfer function associated with the circuit comprises:
a zero at least partially associated with the first capacitor and the first resistive element; and
a pole at least partially associated with the second capacitor and an on-resistance of the first switch,
wherein the zero is substantially equal to the pole.

9. The circuit of claim 5, further comprising a second switch being operable to couple a first input signal line to the second plate of the second capacitor.

10. The circuit of claim 9, further comprising:
a fourth capacitor having a first plate coupled to the first input of the amplifier; and
a third switch being operable to couple the first input signal line to a second plate of the fourth capacitor.

11. The circuit of claim 10, wherein the amplifier further comprises:
a third capacitor; and
a third resistive element in series with the third capacitor, wherein a second output line of the second amplification stage is coupled to a second output line of the first amplification stage through the third capacitor and the third resistive element, and wherein the second output line of the first amplification stage is coupled to a second input line of the second amplification stage.

12. The circuit of claim 11, further comprising:
a fifth capacitor having a first plate coupled to a second input line of the amplifier; and
a fourth switch being operable to couple a second output line of the amplifier to a second plate of the second capacitor.

13. The circuit of claim 12, wherein a classical transfer function associated with the circuit comprises:
a zero at least partially associated with the third capacitor and the third resistive element; and
a pole at least partially associated with the fifth capacitor and an on-resistance of the fourth switch,
wherein the zero is substantially equal to the pole.

14. The circuit of claim 12, further comprising a fifth switch being operable to couple a second input signal line to the second plate of the fifth capacitor.

15. The circuit of claim 14, further comprising:
a sixth capacitor having a first plate coupled to the second input of the amplifier; and
a sixth switch being operable to couple the second input signal line to a second plate of the sixth capacitor.

16. A circuit comprising:
an amplifier comprising a first amplification stage, a second amplification stage having a first input line coupled to a first output line of the first amplification stage, a first resistive element in series with a first capacitor, wherein a first output line of the second amplification stage is coupled to the first output line of the first amplification stage through the first capacitor and the first resistive element;
a second capacitor having a first plate coupled to a first input line of the amplifier; and
a first switch being operable to connect a first output line of the amplifier to a second plate of the second capacitor,
wherein a classical transfer function associated with the circuit comprises a zero at least partially associated with the first capacitor and the first resistive element, and a pole at least partially associated with the second capacitor and an on-resistance of the first switch, wherein the zero is substantially equal to the pole.

17. The circuit of claim 16, wherein the first resistive element comprises at least one field effect transistor.

18. The circuit of claim 16, wherein the first resistive element comprises at least one metal-oxide-semiconductor field effect transistor.

19. The circuit of claim 16, wherein the amplifier further comprises:
   a third capacitor having a first plate coupled to a second output line of the second amplification stage; and
   a third resistive element coupled between the second plate of the third capacitor and a second output line of the first amplification stage, wherein the second output line of the first amplification stage is coupled to a second input line of the second amplification stage.

20. The circuit of claim 16, further comprising a second switch being operable to connect a first input signal line to the second plate of the second capacitor.

21. The circuit of claim 16, wherein the first output line of the first amplification stage is coupled to the first input line of the second amplification stage through a unity gain buffer.

22. A method of compensating a circuit, wherein the circuit comprises an amplifier, and wherein the amplifier comprises a first amplification stage, a second amplification stage having a first input line coupled to a first output line of the first amplification stage, a first resistive element in series with a first capacitor, wherein a first output line of the second amplification stage is coupled to the first output line of the first amplification stage through the first capacitor and the first resistive element, and wherein the circuit further comprises a second capacitor having a first plate coupled to a first input line of the amplifier, and a first switch being operable to connect a first output line of the amplifier to a second plate of the second capacitor, the method comprising:
   selecting a resistance of the first resistive element so that a classical transfer function associated with the circuit comprises a zero at least partially associated with the first capacitor and the first resistive element, wherein the zero is substantially equal to a pole at least partially associated with the second capacitor and an on-resistance of the first switch.

23. The method of claim 22, wherein the first resistive element comprises at least one field effect transistor.

24. The method of claim 23, wherein the first resistive element comprises at least a first metal-oxide-semiconductor field effect transistor.

25. The method of claim 24, wherein the first switch comprises at least a second metal-oxide-semiconductor field effect transistor.

* * * * *